United States Patent [19]

Divecha et al.

[11] Patent Number: 4,569,886

[45] Date of Patent: Feb. 11, 1986

[54] FABRICATION OF NOVEL WHISKER REINFORCED CERAMICS

[75] Inventors: Amarnath P. Divecha, Falls Church, Va.; Roger E. Wilson, Silver Spring, Md.

[73] Assignee: The United States of America as represented by the Secretary of the Navy, Washington, D.C.

[21] Appl. No.: 621,966

[22] Filed: Jun. 18, 1984

[51] Int. Cl.$^4$ .................. B32B 15/00; D02G 3/00; B05D 7/00; B05D 3/02

[52] U.S. Cl. .................................. 428/379; 427/215; 427/226; 427/248.1; 427/294; 428/689; 428/698

[58] Field of Search ............... 427/215, 227, 294, 399, 427/248.1, 226; 419/24, 13, 14, 17; 423/345; 428/379, 698, 689; 75/229, 230, 235, 236, 249, 950

[56] References Cited

U.S. PATENT DOCUMENTS 4,134,759  1/1979  Yajima et al. .................. 419/24 X 4,463,058  7/1984  Hood et al. .................. 419/17 X

FOREIGN PATENT DOCUMENTS 45915  3/1984  Japan .................. 423/345

*Primary Examiner*—Michael R. Lusignan
*Attorney, Agent, or Firm*—Robert F. Beers; Kenneth E. Walden

[57] ABSTRACT

The method of coating ceramic whiskers selected from the group consisting of SiC, graphite, boron carbide and alumina with magnesium by sublimation and finally by magnesium oxide (MgO) after oxidation comprising (a) heating powdered Mg and SiC$_w$ mixture in an oxygen free atmosphere to a temperature of 400° C. to 550° C.

(b) igniting the mixture in air in the presence of O$_2$ (which may incidently cause the mixture to attain a temperature more than 1800° C.) that the desired end results in a coating of MgO on the whisker or particle surfaces, to obtain novel coated whiskers varying in length from 10–100 microns.

17 Claims, No Drawings

FABRICATION OF NOVEL WHISKER REINFORCED CERAMICS

BACKGROUND OF THE INVENTION

Silicon carbide (SiC) and silicon nitride ($Si_3N_4$) solids are covalent compounds. They resist fusion or consolidation via ordinarily used methods such as sintering and even hot pressing. In order to prepare sound solids from SiC and $Si_3N_4$ powders, it is therefore necessary to add sintering aids such as magnesia (MgO), or yttria and alumina. Of these, magnesia is the most preferred additive in certain cases such as high temperature bearings. References attesting to this need for additives are available.

In recent years, the demands on metallic materials' performance has increased substantially. For example, turbine blades and bearings are increasingly subjected to higher operating temperatures. Thus, while jet engine components operate at ~1800° F., there is a great need for raising the operating temperatures to as high as 2400° F. No known metallic material, be it steel, cobalt, or a nickel base alloy, meets the requirements for operation at, say, 2000 to 2200° F. for long periods of time. If jet engines can be operated at these temperatures, considerable gains in performance can be attained. Ceramics such as SiC, $Si_3N_4$ and combinations of the two are considered as potential replacements of metallic alloy. This invention is concerned with "new" approach(es) capable of yielding dense $Si_3N_4$ and SiC composite materials of high strength and high fracture toughness. In particular, the method affords a novel technique for fabricating SiC whisker reinforced ceramics.

U.S. Pat. No. 4,134,759 to Yajima discloses the coating of long SiC fibers with liquid molten magnesium. The coating of short fibers or whiskers made of SiC presents a different problem than the one confronting Yajima.

In the Yajima patent the long fibers of SiC are pulled or advanced through a bath of molten Mg. The Yajima method could therefore, not be applied to the coating of very short fibrous materials.

SUMMARY OF THE INVENTION

This invention relates to a method of fabricating a novel whisker reinforced ceramic by coacting SiC or other ceramic fibers or whiskers with metallic magnesium by a sublimation process.

The novel method used to coat the fibers or whiskers consists of maintaining the magnesium metal in a state of sublimation in an oxygen free atmosphere until the ceramic whiskers are coated with the magnesium which quickly deposites as a hard uniform solid coating. The metallic magnesium is then converted to the oxide by ignition in air.

The coated whiskers or other short fibers are then bonded by a matrix such as glass, SiC or $Si_3N_4$ by admixing them with particulates either dry or in a slurry and sintering or hot pressing. Also, the coated fibers or whiskers may be bonded to form a composite by organometallic impregnation or chemical vapor deposition (CVD) techniques.

OBJECTS OF THE INVENTION

The ceramic composite systems envisaged under this invention include silicon carbide whisker ($SiC_w$) reinforced silicon carbides, silicon carbide whisker reinforced alumina, silicon carbide reinforced silicon nitride, and silicon carbide whisker reinforced glass or glass ceramic etc.

It is one important object of this invention to provide a method for coating silicon carbide whiskers and other equivalent ceramic fibers with magnesium in a process in which the coating is applied by sublimation.

It is another object of this invention to coat a powdered ceramic such as SiC or silicon nitride or equivalent whiskers with Mg by the novel sublimation process of this invention as a means of fabricating a novel composite material.

It is one additional object of the invention to provide a light weight, strong, fracture-tough composite ceramic material by incorporating silicon carbide or equivalent whiskers that are coated with magnesium oxide where the coating has been applied by sublimation of the metal followed by oxidation in air to form MgO.

It is one further object of the invention to provide a lightweight strong tough ceramic composite material that has greater fracture toughness than standard ceramics because of the use of the silicon carbide whiskers coated with a uniform magnesium oxides (MgO) coating applied by the sublimation process of this invention.

It is one other object of the invention to provide a method for coating short ceramic fibers such as graphite, boron carbide and other ceramic fibers with a magnesium coating applied by the novel sublimation process of this invention.

DETAILED DESCRIPTION OF THE PREFERRED EMBODIMENT

It is the purpose of this invention to provide a novel method of fabricating whisker reinforced ceramics. In conventional practice, ceramics are generally fabricated from fine powders which are cold pressed at high pressure and then sintered at high temperature or they are hot pressed at high temperatures and pressures. In either case the un-coated SiC whiskers or other ceramic fibers are attacked by the matrix materials and are destroyed. It is the purpose of this invention to prevent the destruction of the reinforcing whiskers or fibers by the matrix during high temperature treatments. Such destruction is prevented by the application or deposition of a coating of MgO on the surface of the fibers.

The fibers or whiskers that can be coated with magnesium according to the novel methods of this invention include (and are selected from the group consisting of) SiC, $Si_3N_4$, $Al_2O_3$, and $B_4C$. The preferred members of this group are SiC and $Si_3N_4$ and are of particular interest because of their hardness, high melting points, excellent oxidation resistance combined with their relatively high toughness, strength and low specific gravity. The Whiskers may be from about 1 to about 100 microns in length. Whiskers or fibers varying in length from about 1 micron to 25 microns are preferred. Whiskers under 10 microns in lengths may not be commercially available, in which case fibers from 10 and 100 microns in length would be preferred with whiskers from 10 to 25 micron being more preferred. The whiskers are preferably from 0.4 to 0.9 microns in diameter. Of course, even shorter or longer whiskers or fibers may be utilized as a practice or as may be desired.

SUBLIMATION COATING OF WHISKERS

In the practice of this invention silicon carbide and other equivalent fibers and whiskers particularly short whiskers (short fibers) such as Si$_3$N$_4$, SiC, B$_4$C and Al$_2$O$_3$ and other equivalent short fibers or whiskers are treated in a chamber with magnesium that is allowed to sublime in an inert atmosphere at temperatures well below the melting point of magnesium.

Magnesium is one of the very few structural materials that possesses high vapor pressure at temperatures well below its melting point.

Therefore when magnesium is heated to, for example 400° C. it will begin to vaporize even though it is approximately 260° below its melting point. In other words, if magnesium is maintained at 400° C. for 3 or 4 days and the pressure adjusted to approximately 1 atmosphere, (760 mm of mercury) there will be substantial weight loss due to sublimation. That is to say, magnesium will vaporize to some degree at that temperature and pressure. The temperature and pressure within which the applicant intends to operate this invention is from about 400° C. to 550° C.

The pressure should be maintained in the range of 0.75 atmospheres to 1.25 atmospheres of pressure in an inert, oxygen free atmosphere, such as helium or argon.

The whiskers or short fibers ranging from about 10 to 100 microns of silicon carbide or other equivalent whiskers as stated above may be treated with magnesium in an inert atmosphere at pressures from less 1 atmosphere to no more than 2 atmospheres of pressure. Shorter fibers such as 1 to 10 microns may be used as well but may not be commercially available.

Additionally, in one preferred embodiment fine alumina matrix powder (−200 +325 mesh) may be mixed with silicon carbide whiskers and silicon carbide powder or any of the materials listed above such as Si$_3$N$_4$ or B$_4$C and other equivalent ceramic matrix powders.

The final step of the invention is to remove the whisker/matrix mixture from the inert atmosphere to an oxidizing atmosphere and ignite the mixture by a spark or flame to initiate oxidation. Under proper conditions the magnesium coating on the silicon carbide whiskers or silicon carbide power will oxidize to magnesium oxide.

EXAMPLE 1

1. Mix fine (−250° mesh) Mg powder with SiC whiskers (Silag SC9) and SiC powder.

2. Place the mixture in a furnace heated to 500° C. in an inert atmosphere. The Mg powder with its large surface area will sublime copiously and vaporize. As it vaporizes, it will spontaneously coat everything in its vicinity with a thin coating of Mg. It has been observed that Mg coating on SiC is most uniform in the range of 400° C.–500° C. Stirring of the mixture is very important to achieve a uniform coating.

Summarizing the experimental steps:

1. Mix SiC$_w$ and SiC$_p$ Silag SC9 with −250 mesh Mg powder.

2. Heat in the range of 400°–550° C. in helium or other inert gas containing PPM oxygen at approximately one atmosphere of pressure.

3. Ignite the mixture in ordinary air or a gas enriched with oxygen. Theoretically a 100% oxygen atmosphere is desirable, however, ambient air with 20% O$_2$ is adequate.

Obviously numerous modifications and variations of the present invention are possible in light of the above teachings. It is therefore to be understood within the scope of the appended claims the invention may be practiced otherwise than as specifically described herein.

What is claimed as new and secured by Letters Patent of the United States is:

1. A process for forming a protective coating on whiskers comprising the following steps in order:
   (a) coating whiskers which are form about 1 to about 100 microns in length and which are made of a material selected from the group consisting of SiC, Si$_3$N$_4$, Al$_2$O$_3$, and B$_4$C with magnesium by exposing the whiskers to magnesium vapor which is produce by sublimating the magnesium at a temperature of from 400° C. to 550° C. in an inert, oxygen free atmosphere at a pressure of from 0.75 to 1.25 atmospheres; and then
   (b) igniting the magnesium coated whiskers in an oxygen containing environment to convert the magnesium coating to a magnesium oxide coating.

2. A process according to claim 1 wherein the whiskers are made of SiC.

3. A process according to claim 1 wherein the whiskers are made of Si$_3$N$_4$.

4. A process according to claim 1 wherein the magnesium in step (a) is heated to a temperature of from 400° C. to 500° C.

5. A process according to claim 1 wherein the magnesium coated whiskers are ignited in air in step (b).

6. A process according to claim 1 wherein the magnesium coated whiskers are ignited in an atmosphere containing from 20 to 100 percent of oxygen in step (b).

7. A process according to claim 1 wherein the magnesium coated whiskers are ignited in pure oxygen in step (b).

8. The process of claim 1 wherein the whiskers are from about 1 to 25 microns in length.

9. The process of claim 1 wherein the whiskers are from 10 to about 100 microns in length.

10. The process of claim 9 wherein the whiskers are from 10 to 25 microns in length.

11. The process of claim 1 wherein the whiskers are from 0.4 to 0.9 microns in diameter.

12. A magnesium oxide coated whisker which is produced according to the process of claim 1.

13. A magnesium oxide coated whisker which is produced according to the process of claim 2.

14. A magnesium oxide coated whisker which is produced according to the process of claim 3.

15. A magnesium oxide coated whisker which is produced according to the process of claim 8.

16. A magnesium oxide coated whisker which is produced according to the process of claim 9.

17. A magnesium oxide coated whisker which is produced according to the process of claim 10.

* * * * *